United States Patent [19]
Yokoyama

[11] Patent Number: 4,566,021
[45] Date of Patent: Jan. 21, 1986

[54] SEMICONDUCTOR DEVICE

[75] Inventor: Naoki Yokoyama, Yokohama, Japan

[73] Assignee: Fujitsu Limited, Kawasaki, Japan

[21] Appl. No.: 721,144

[22] Filed: Apr. 10, 1985

Related U.S. Application Data

[63] Continuation of Ser. No. 334,923, Dec. 28, 1981, abandoned.

[30] Foreign Application Priority Data

Dec. 30, 1980 [JP] Japan .................................. 55-189544

[51] Int. Cl.[4] ....................... H01L 25/54; H01L 29/48
[52] U.S. Cl. ........................................ 357/15; 357/22;
357/67; 357/71
[58] Field of Search ..................... 357/15, 22, 675, 715

[56] References Cited

U.S. PATENT DOCUMENTS 3,582,324  6/1971  Kunert et al. ..................... 357/67 S
4,263,605  4/1981  Christou et al. ........................ 357/71
4,321,612  4/1982  Murata et al. .......................... 357/15

FOREIGN PATENT DOCUMENTS 50-8310   4/1975  Japan ................................. 357/15 P
56-140667 11/1981 Japan ................................. 357/225

OTHER PUBLICATIONS

DeWitt, D., "Field Effect Transistor" *IBM Technical Disclosure Bulletin*, vol. 9, No. 1, p. 102 (Jun., 1966).
Murarka, S. P., "Refractory Silicides for Integrated Circuits" J. Vac. Sci. Technol., 17 (4), Jul., Aug. 1980 pp. 775-792.

*Primary Examiner*—Andrew J. James
*Assistant Examiner*—S. V. Clark
*Attorney, Agent, or Firm*—Staas & Halsey

[57] ABSTRACT

A Schottky gate electrode of a refractory metal silicide is formed on a compound semiconductor, by which the barrier height is maintained satisfactorily even after heat treatment above 800° C. Accordingly, it is possible to form an impurity diffused region using the Schottky gate electrode as a mask and then to effect the recrystallization of the semiconductor or the activation of the impurity by heat treatment, so that source and drain regions can be positioned by self-alignment relative to the gate electrode.

14 Claims, 16 Drawing Figures

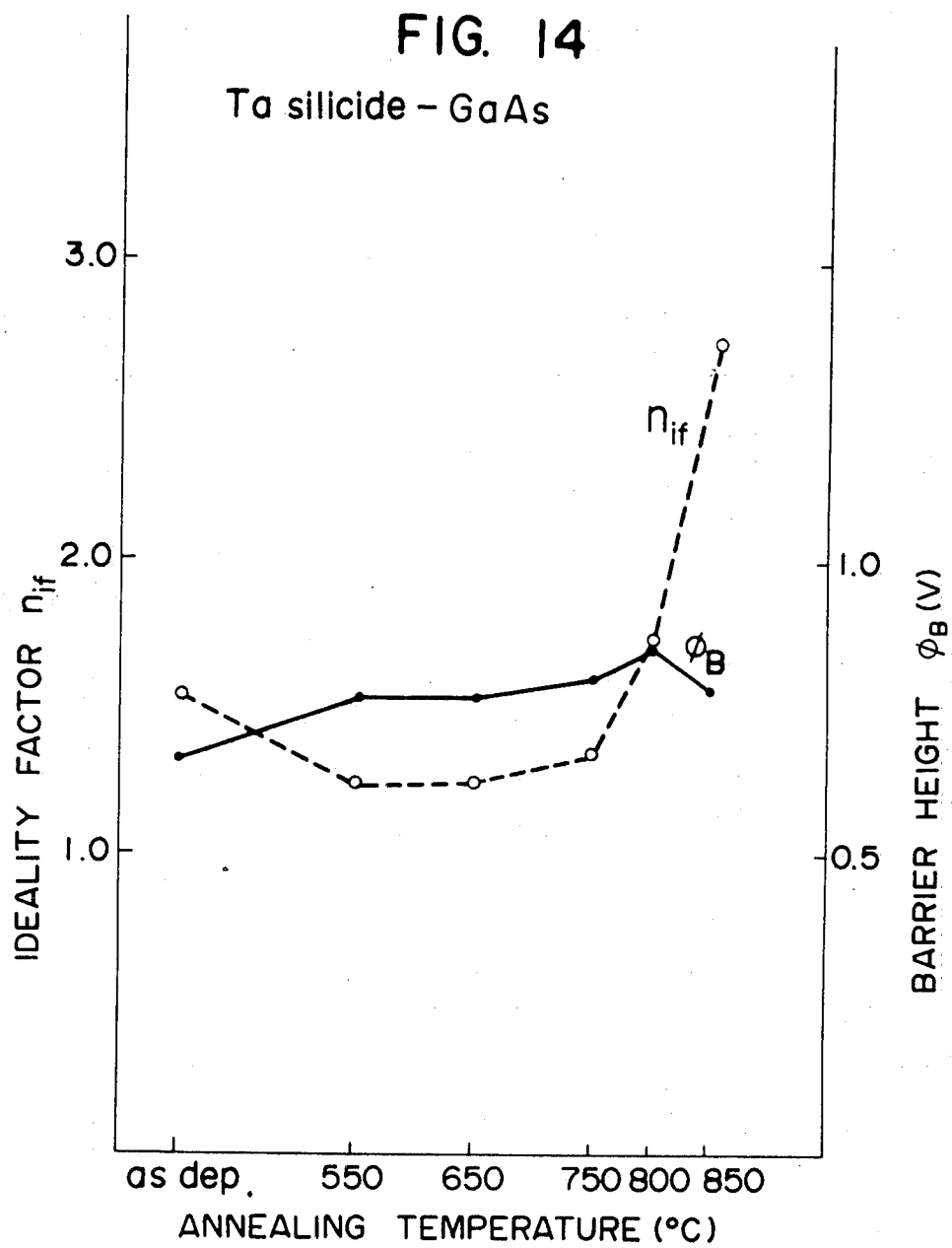

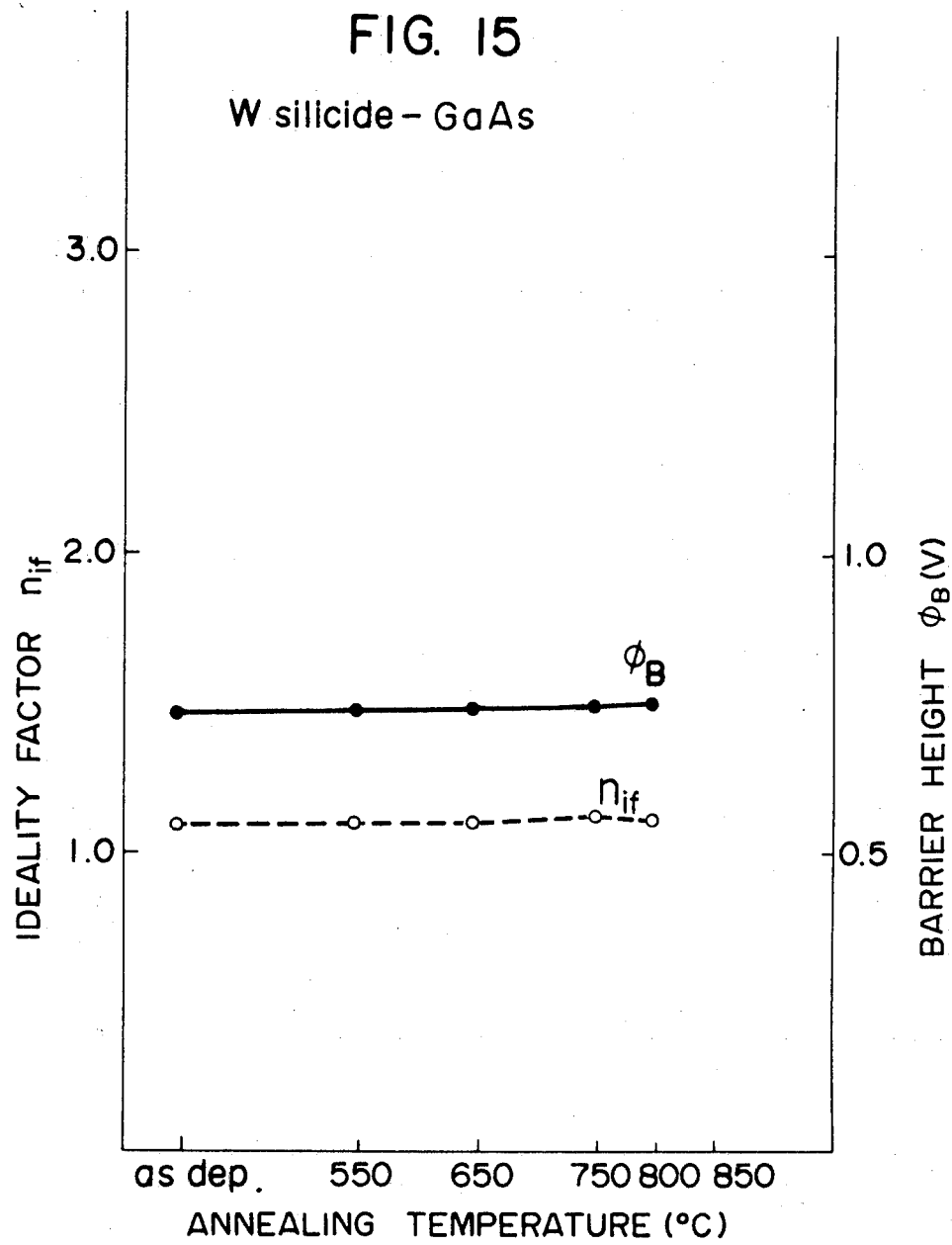

SEMICONDUCTOR DEVICE

This is a continuation of co-pending application Ser. No. 334,923 filed on Dec. 28, 1981, now abandoned.

BACKGROUND OF THE INVENTION

The present invention relates to a semiconductor device using a compound semiconductor, such as a Schottky gate field effect transistor, and a method for the manufacture of the same.

Heretofore, metals such as aluminum(Al), gold(Au), titanium(Ti), molybdenum(Mo), tungsten(W), tantalum(Ta) and so forth have been employed, for example, for a gate electrode of GaAs Schottky gate field effect transistors. With any of these metals, however, when it is heat-treated at about 600° C., the electrical properties of the gate electrode, such as, for example, the barrier height, the ideality factor and the reverse breakdown voltage are degraded, making the transistor operation impossible.

As a solution to this problem, it has recently been proposed to use a Ti/W alloy for the gate electrode.

But this alloy also cannot withstand, for example, a 800° C. heat treatment, which results in a loss or degradation of the barrier to make the operation unstable. In addition to this, if an ordinary manufacturing process is adopted, the gate electrode may sometimes be corroded which increases its resistivity or causes it to flake off.

SUMMARY OF THE INVENTION

It is an object of the present invention to provide a semiconductor device, such as a field effect transistor, in which a Schottky gate electrode arranged on a compound semiconductor is formed of a silicide of a refractory metal and which is capable of enduring heat treatment up to above 800° C.

According to the present invention, an impurity can be introduced to form regions by the so-called self-alignment method using the gate electrode as a mask, that is, source and drain regions can be positioned relative to the gate electrode through self-alignment.

BRIEF DESCRIPTION OF THE DRAWINGS

FIGS. 12 to 15 are graphs showing the relationships of the barrier height $\phi_B$ and the ideality factor $n_{if}$ to the annealing temperature.

DETAILED DESCRIPTION OF THE PREFERRED EMBODIMENTS

Figure 1:
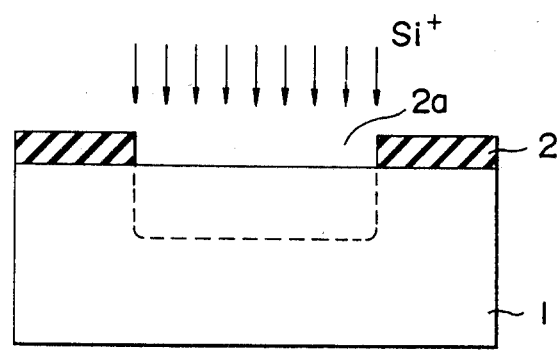
FIGS. 1 to 6 schematically show, in section, a sequence of steps involved in the manufacture of a semiconductor device according to an embodiment of the present invention.
Figure 2:
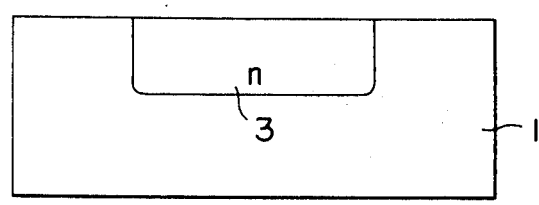
Figure 3:
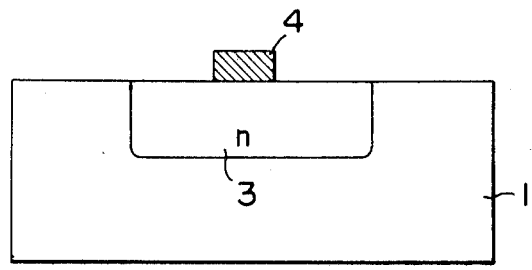
Figure 4:
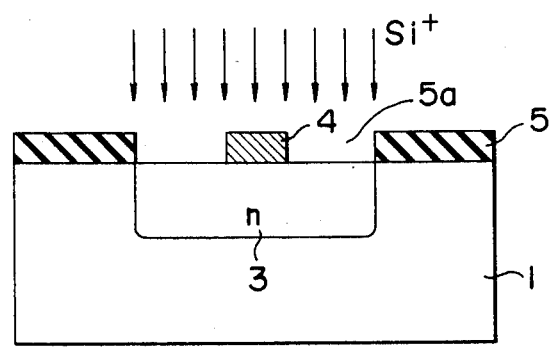
Figure 5:
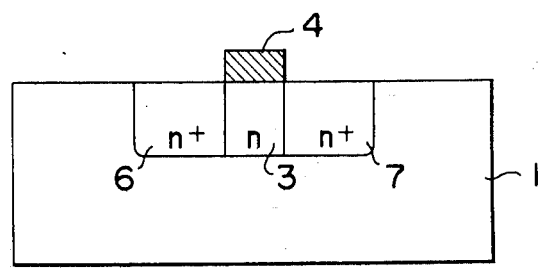
Figure 6:
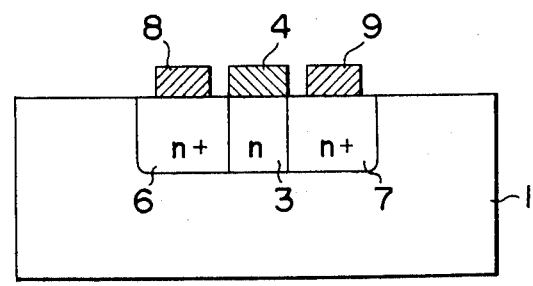

A Schottky contact as described herein includes contacts in which an electrode metal makes direct contact with a semiconductor substrate to provide rectifying characteristics, in which the electrode metal makes direct contact and causes alloying or sintering therebetween to yield the rectifying characteristics, or in which the electrode metal is disposed on the semiconductor substrate through an insulating film such as a natural oxide film on the substrate surface so that the rectifying characteristics are developed by a tunnel phenomenon (a tunnel current) in the insulating film.

A description will be given, with reference to FIGS. 1 to 6, of the manufacture of a semiconductor device in accordance with an embodiment of the present invention.

FIG. 1:

(1) A silicon dioxide film 2 is formed, for example, 6000 Å thick, on a GaAs semi-insulating substrate 1 doped with chromium and subjected to patterning by a known method to form a window 2a.

(2) Silicon is implanted into the substrate 1 through the window 2a by means of ion implantation with an accelerating energy of 175 KeV and a dose of $2.6 \times 10^{12}$ cm$^{-2}$, while using the silicon dioxide film 2 as a mask.

FIG. 2:

(3) After removing the remaining silicon dioxide film 2, a silicon dioxide film is newly formed to a thickness of, for example, approximately 1000 Å, and the substrate assembly is heat-treated at a temperature of, for instance, 850° C., for a certain period of time, for example, 15 minutes, thereby to obtain an n type layer 3 as shown. A newly formed silicon dioxide film for preventing out-diffusion is removed after the heat treatment.

The n type layer 3 may also be formed by an epitaxial growth method on the semiconductor substrate 1 instead of such a selective ion implantation method as described above.

FIG. 3:

(4) A Ti/W silicide alloy of such a composition, for example, as $(Ti_{0.3}W_{0.7})Si_2$, is deposited by sputtering to form an alloy film, for example, 6000 Å thick, and the film is subjected to patterning by dry etching using an etchant composed of $CF_4 + O_2$ (5%) and the silicon dioxide film as a mask (not shown). Thus a gate electrode 4 is formed.

FIG. 4:

(5) A silicon dioxide film 5 is formed and selectively removed by patterning to provide a window 5a exposing the surface of the n type layer 3.

(6) Silicon is implanted into the n type layer 3 through the window 5a by an ion implantation method with an accelerating energy of 175 KeV and a dose of $1.7 \times 10^{13}$ cm$^{-2}$, while using the gate electrode 4 and the silicon dioxide film 5 as a mask.

FIG. 5:

(7) After removing the remaining silicon dioxide film 5, a silicon dioxide film is newly formed, for example, with a thickness of about 1000 Å, and the substrate assembly is heat-treated, for example, at 800° C., for 15 minutes or so, thereby forming n+ type regions 6 and 7 as shown. The newly formed silicon dioxide film is removed after the heat treatment.

The impurity concentration in each of the n+ type regions 6 and 7 thus formed is $1 \times 10^{18}$ cm$^{-3}$ at its peak and the impurity concentration in the n type layer 3 is $1 \times 10^{17}$ cm$^{-3}$ similarly at its peak.

FIG. 6:

(8) Electrodes 8 and 9 are formed by known techniques on the n+ type regions 6 and 7, respectively. The electrodes 8 and 9 may be formed of the AuGe/Au series. Either one of the electrodes 8 and 9 is used as the source electrode and the other as the drain electrode.

Incidentally, if a leak current of the gate tends to increase, then the surface of the GaAs portion is etched away by about 100 Å prior to the formation of the electrodes 8 and 9. The etchant therefor may be $KOH+H_2O_2$.

Figure 7:
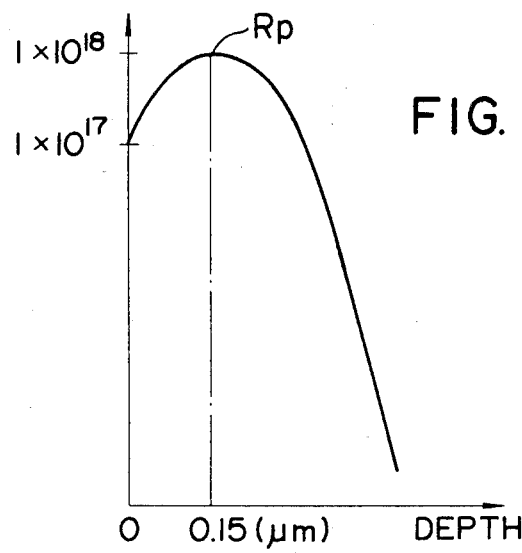
FIG. 7 is a graph showing the impurity concentration distribution in an impurity diffused region.

Performance data of the field effect transistor thus manufactured are as follows:
  Gate length: 1.4 μm
  Gate width: 200 μm
  Source-drain spacing: 6 μm
  gm: 23 mƱ
  Cgs (capacitance between source and gate): 0.30 pF
  $f_T$ (cutoff frequency): 12.3 GHz
  Schottky gate
  $n_{if}$ (ideality factor): 1.18
  Barrier height $\phi_B$: 0.78 V
  Breakdown voltage: 6.0 V Since the n+ type regions 6 and 7 are formed by self-alignment using the gate electrode 4 as a mask, a short therebetween may generally be feared, but this is avoided in the present invention. That is, in the n+ type regions 6 and 7 formed by the method described above, the impurity concentration distribution is a Gaussion distribution as shown in FIG. 7. The peak depth ($R_p$) of the distribution is, for example, 0.15 μm, and if the impurity concentration at the peak is $1 \times 10^{18}$ cm$^{-3}$, then the impurity concentration at the surface is approximately $1 \times 10^{17}$ cm$^{-3}$, which provides a breakdown voltage of higher than 5 V.

For maintaining the reverse breakdown voltage of the Schottky gate electrode, the following steps can be taken:

(1) the dose of the impurity for the n+ type regions 6 and 7 is reduced;

(2) after the formation of the n+ type regions 6 and 7, the Schottky gate electrode 4 is made thin by etching;

(3) the Schottky gate electrode 4 is insulated;

(4) the surfaces of the n+ type regions 6 and 7 are etched;

(5) prior to the formation of the n+ type regions 6 and 7, the Schottky gate electrode 4 to be used as a mask is worked into an umbrella-like shape, or an umbrella-shaped mask is provided separately before the ion implantation;

(6) the energy for the ion implantation is raised to increase the peak depth Rp (in the foregoing embodiment).

In the present invention the method 6 is basically employed but may also be combined with any of the other methods mentioned above, as required. Data the Schottky withstand voltage for the GaAs n+ type region are as follows:

| Concentration in flat layer or peak concentration in ion-implanted layer | n+ type flat layer by epitaxial growth or the like | Si—ion-implanted n+ type layer with Gaussian distribution | |
|---|---|---|---|
| | | E: 175 Kev $R_p$: 0.150μ | E: 350 Kev $R_p$: 0.306μ |
| $2 \times 10^{18}$ cm$^{-3}$ | 0.85 V | 3.65 V | 7.77 V |
| $1 \times 10^{18}$ cm$^{-3}$ | 1.69 V | 6.0 V | 10.2 V |
| $5 \times 10^{17}$ cm$^{-3}$ | 3.39 V | 8.30 V | 13.3 V |

The present invention involves the use of the refractory metal silicide as the electrode material so that the Schottky gate electrode can be positioned by self-alignment, that is, the formation of the Schottky gate electrode can be followed by heat treatment for activation of the implanted ions. The following table shows a comparison of Ti/W and Ti/W silicide alloys.

| | TiW (Ti: 10 wt %) | $Ti_xW_{1-x}Si_2$ (Ti: 10 wt %) |
|---|---|---|
| Resistivity (after heat treatment at 850° C. for 15 minutes) | $2\sim3 \times 10^4$ Ω · cm | $0.8\sim1 \times 10^{-4}$ Ω · cm |
| corrosion rate by HF (conc) | 1 μm/minute | 0 |
| corrosion rate by $NH_4F:HF = 10:1$ | 1200 Å/minute | 0 |
| Stability of Schottky junction after heat treatment at 800° C. for 15 minutes | about 50% degraded. Unstable | about 100%, stable Schottky characteristics Barrier height: 0.78 V $n_{if}$: 1.18 |

Figure 8:
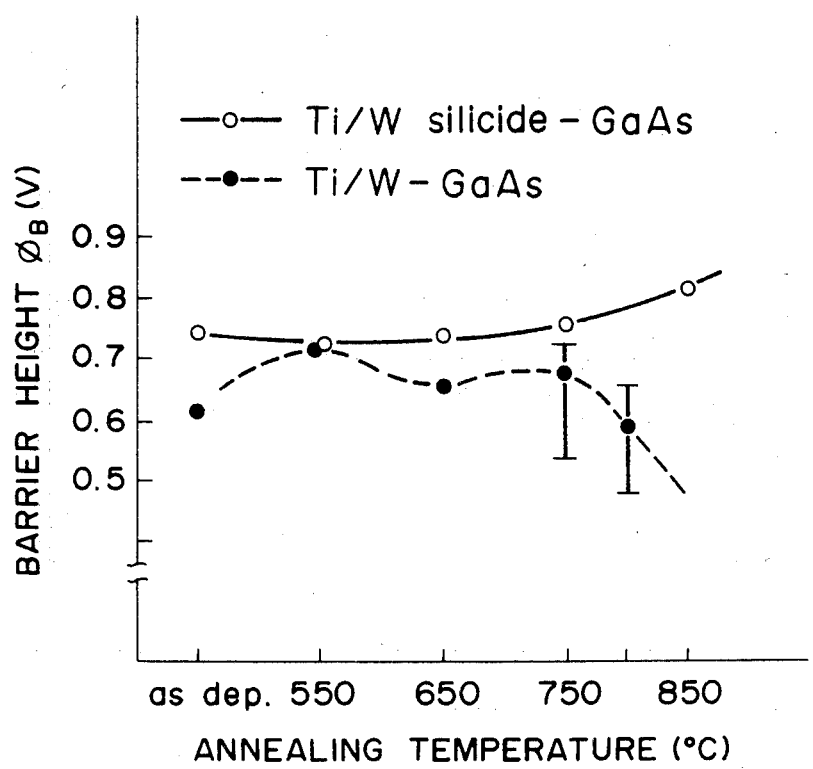
FIG. 8 is a graph showing the relation between the barrier height $\phi_B$ and the annealing temperature.

FIG. 8 is a graph showing the relationship between the barrier height $\phi_B$ and the annealing temperature, wherein the ordinate represents the barrier height $\phi_B$ (V) and the abscissa the annealing temperature (°C.). In FIG. 8, the solid line shows the characteristics of the Ti/W silicide alloy and the broken line the characteristics of the Ti/W alloy.

As will be seen from FIG. 8, the barrier height in the case of the Ti/W silicide alloy is more stable against heat treatment than in the case of the Ti/W alloy.

Figure 9:
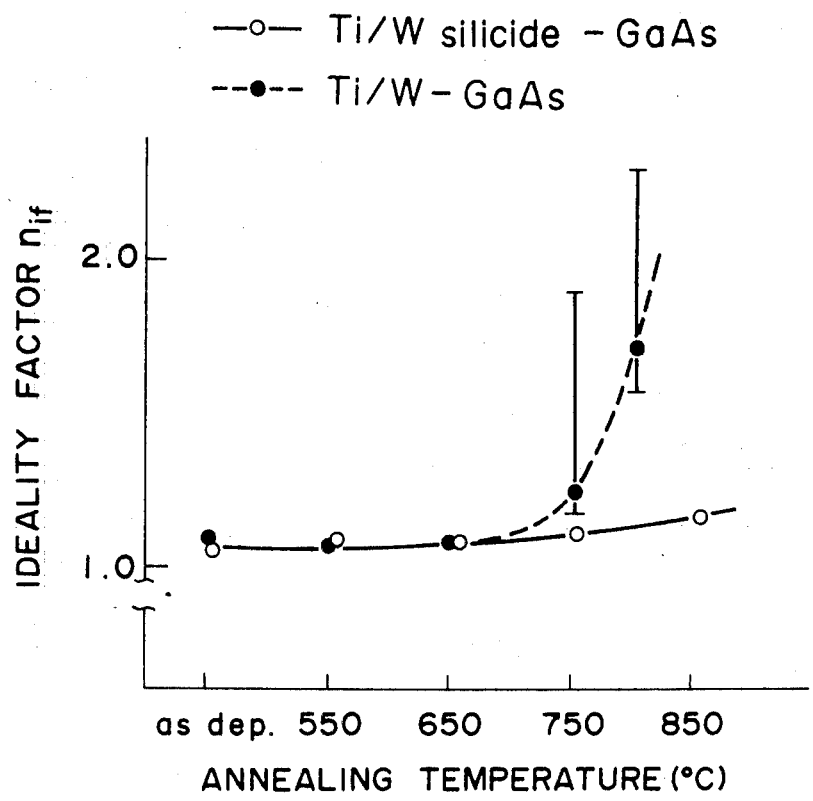
FIG. 9 is a graph showing the relation between the ideality factor $n_{if}$ and the annealing temperature.

FIG. 9 is a graph showing the relationship between the ideality factor $n_{if}$ and the annealing temperature, wherein the ordinate represents the ideality factor $n_{if}$ and the abscissa the annealing temperature (°C.). The solid line indicates the characteristics of the Ti/W silicide alloy and the broken line the characteristics of the Ti/W alloy.

As will be understood from FIG. 9, the ideality factor $n_{if}$ of the Ti/W silicide alloy slightly increases with the annealing temperature but this increase is so negligibly small that the ideality factor $n_{if}$ can be regarded as almost constant as compared with the ideality factor $n_{if}$ of the Ti/W alloy.

Figure 10:
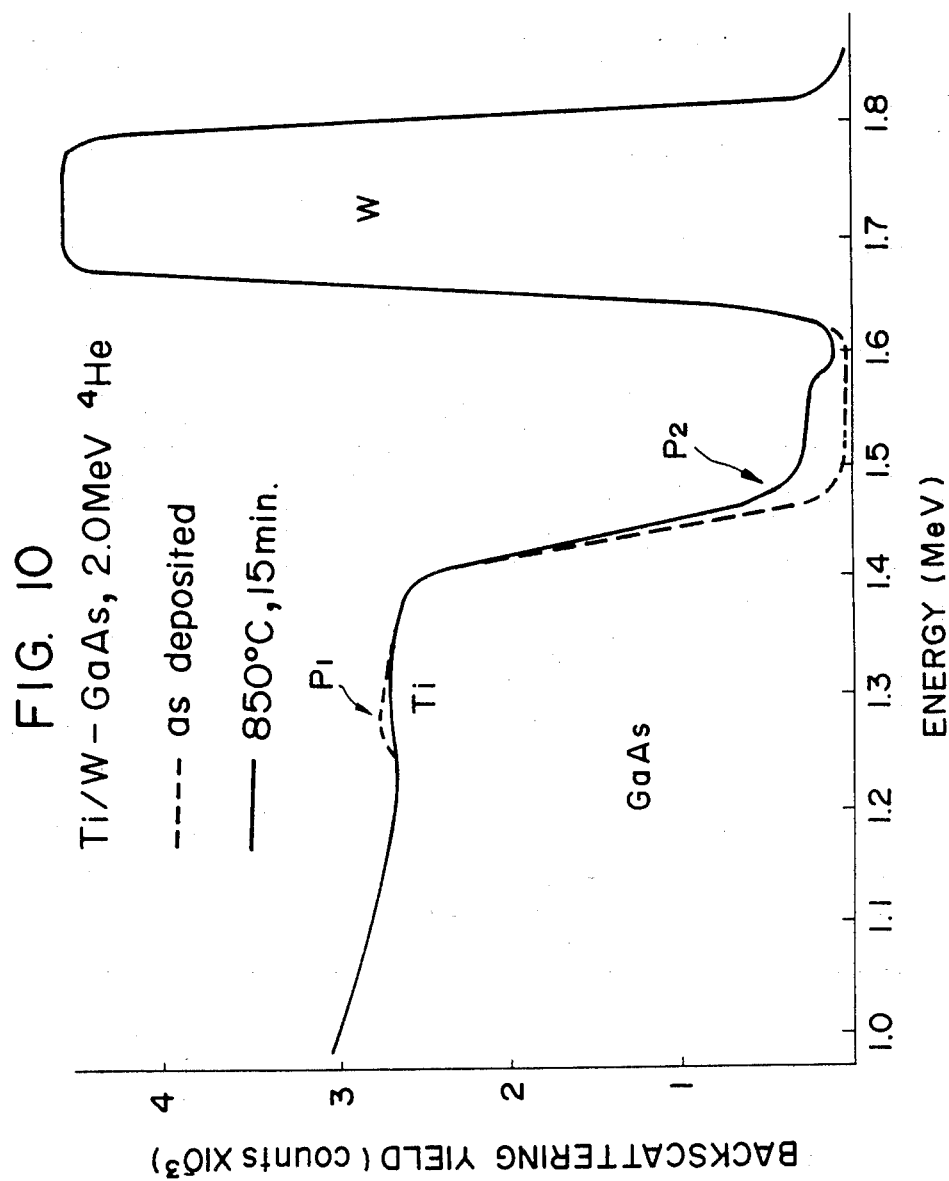
FIGS. 10 and 11 are graphs showing the results of Rutherford backscattering measurement.
Figure 11:
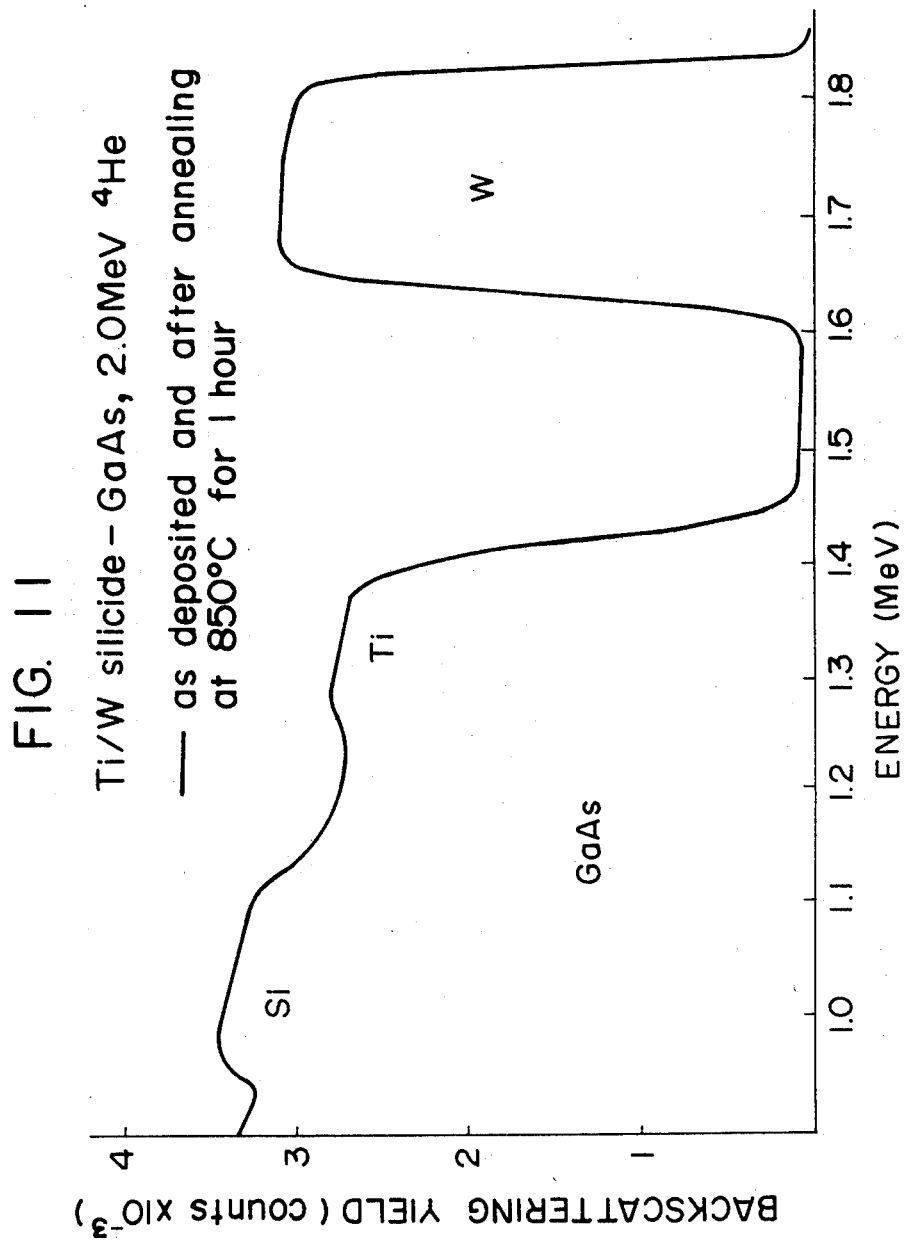

FIGS. 10 and 11 are graphs showing the results of examination of reaction between substances as studied by a backscattering method using $^4$He with an accelerating energy of 2.0 MeV, where the ordinate represents the count of backscattered $^4$He and the abscissa the energy of backscattered $^4$He.

FIG. 10 indicates the case of the Ti/W alloy being used, wherein the solid line shows the spectrum obtained in the case where the deposited Ti/W alloy was held as it was, and the broken line shows the spectrum obtained after annealing in a hydrogen ($H_2$) atmosphere at 850° C. for 15 minutes.

It must be noted here that titanium moved into the GaAs after annealing as seen from of the portion indicated by the arrow $P_1$, and that, after annealing, a signal appeared in an originally signal-free section (of 1.5 to 1.6 MeV energy) as indicated by the arrow $P_2$. This indicates that GaAs moved towards the surface (corresponding to the right-hand side of FIG. 10).

FIG. 11 shows the case of the Ti/W silicide alloy being used. There is no difference in the spectrums of the case of the Ti/W deposited silicide alloy being held as it was and the case of the alloy being annealed in a hydrogen ($H_2$) atmosphere at 850° C. for an hour.

The following tables show measured values of the barrier height $\phi_B$ and the ideality factor $n_{if}$ of Schottky electrodes formed of other refractory metals of molybdenum, tantalum and tungsten and their silicides.

|  |  | as deposited | 550° C. | 650° C. | 750° C. | 800° C. | 850° C. |
|---|---|---|---|---|---|---|---|
| Mo | $\phi_B$ | 0.583 ± 0.044 V | 0.506 ± 0.001 V | 0.489 ± 0.008 V | 0.747 ± 0.003 V | 0.573 ± 0.016 V | 0.532 ± 0.021 V |
|  | $n_{if}$ | 1.15 ± 0.01 | 1.10 ± 0.01 | 1.11 ± 0.01 | 1.17 ± 0.01 | 1.69 ± 0.10 | 2.84 ± 0.63 |
| MoSi | $\phi_B$ | 0.704 ± 0.003 V | 0.720 ± 0.002 V | 0.725 ± 0.007 V | 0.725 ± 0.004 V | 0.729 ± 0.004 V | 0.753 ± 0.005 V |
|  | $n_{if}$ | 1.16 ± 0.01 | 1.23 ± 0.01 | 1.24 ± 0.02 | 1.29 ± 0.03 | 1.31 ± 0.03 | 1.25 ± 0.03 |
| Ta | $\phi_B$ | 0.665 ± 0.002 V | — | — | — | — | — |
|  | $n_{if}$ | 1.19 ± 0.01 | — | — | — | — | — |
| TaSi | $\phi_B$ | 0.632 ± 0.018 V | 0.741 ± 0.003 V | 0.746 ± 0.002 V | 0.782 ± 0.006 V | 0.837 ± 0.028 V | 0.766 ± 0.014 V |
|  | $n_{if}$ | 1.47 ± 0.18 | 1.18 ± 0.01 | 1.20 ± 0.01 | 1.31 ± 0.01 | 1.69 ± 0.23 | 2.73 ± 0.20 |
| W | $\phi_B$ | 0.71 ± 0.01 V | — | — | — | — | — |
|  | $n_{if}$ | 1.08 ± 0.01 | — | — | — | — | — |
| WSi | $\phi_B$ | 0.730 ± 0.005 V |  | 0.75 ± 0.01 V | 0.75 ± 0.2 V | 0.76 ± 0.02 V |  |
|  | $n_{if}$ | 1.09 ± 0.01 |  | 1.12 ± 0.02 | 1.14 ± 0.04 | 1.12 ± 0.02 |  |

The above shows that the silicide is very stable against heat treatment in any case. The reason for which no data is given for tantalum at temperatures above 550° C. is that the tantalum film, when heated up to such high temperatures, flakes off the GaAs substrate, owing to its coefficient of expansion. Further, in the case of tungsten, the rectifying characteristics are lost at such temperatures.

Figure 12:
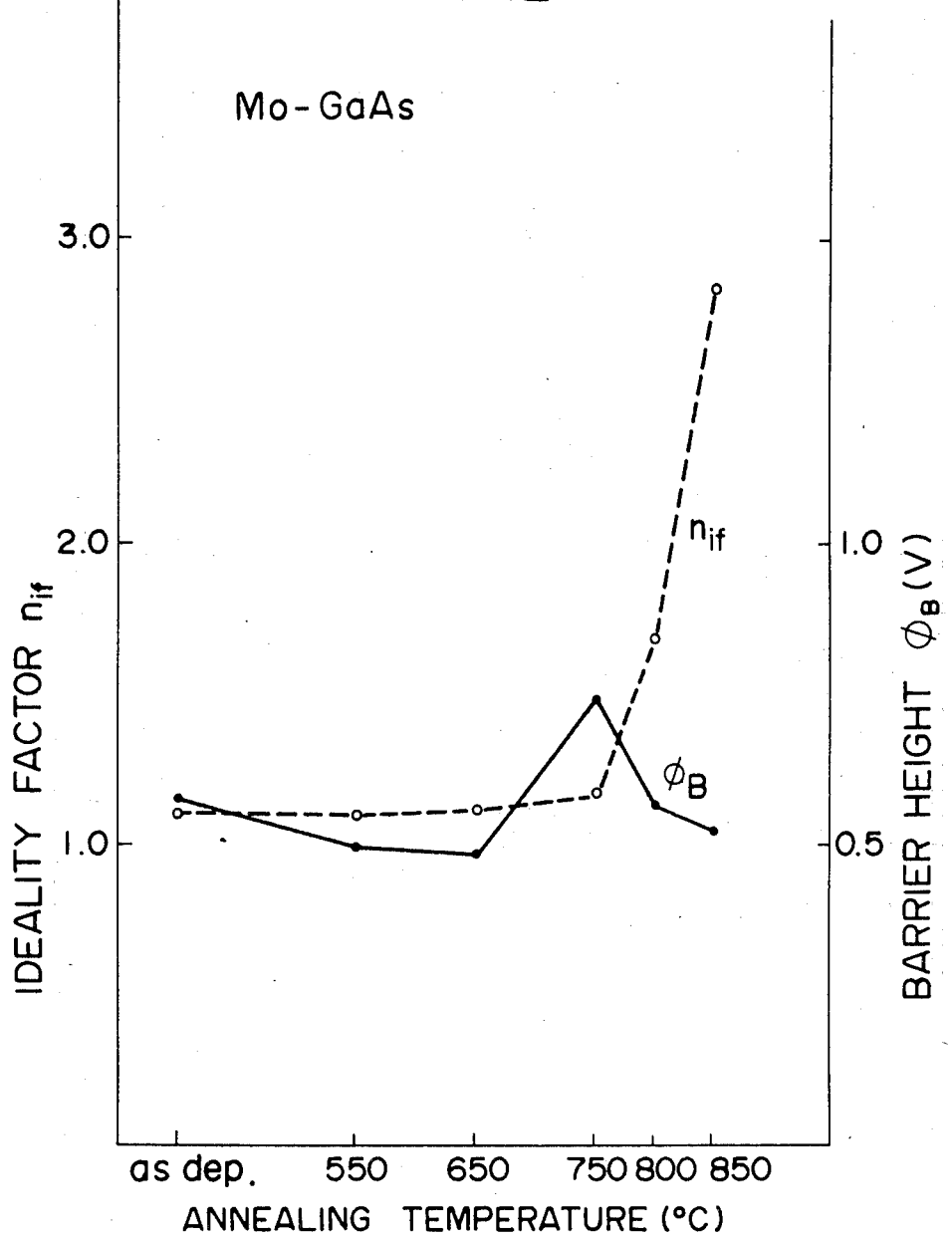
Figure 13:
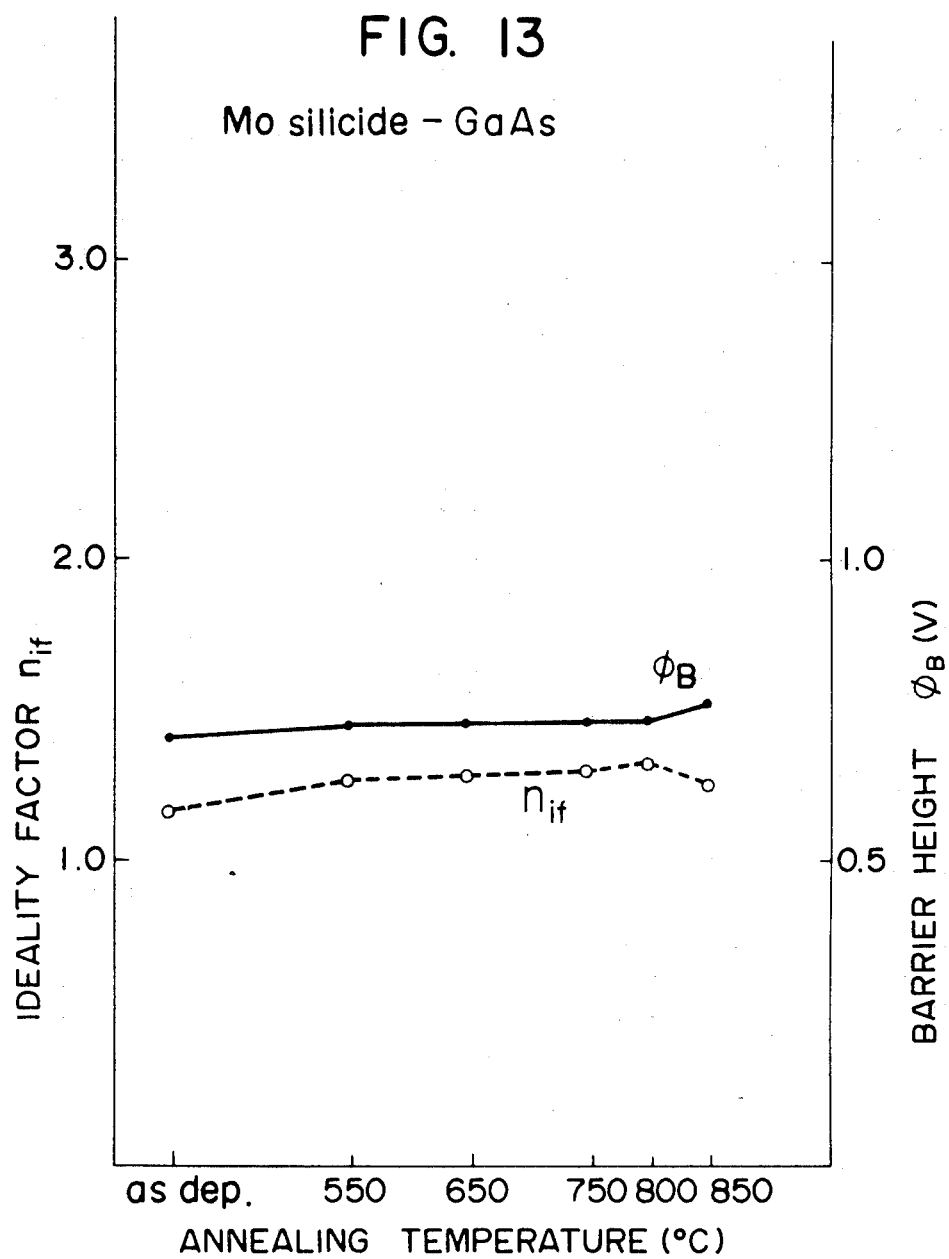

FIGS. 12 to 15 are graphical representations of the data given in the above tables. The left-hand ordinate represents the ideality factor $n_{if}$, the right-hand ordinate the barrier height $\phi_B$ and the abscissa the annealing temperature, the solid line showing the barrier height $\phi_B$ and the broken line the ideality factor $n_{if}$. FIG. 12 shows the case of molybdenum, FIG. 13 the case of MoSi, FIG. 14 the case of TaSi and FIG. 15 the case of WSi. As regards tantalum and tungsten alone on the substrate, no data are obtainable as explained above, and hence graphical showings are meaningless.

As will be appreciated from the data given above, even if the refractory metal silicide according to the present invention is subjected to high temperature heat treatment, for example, for the activation of implanted ions, the Schottky contact is retained between the ion-implanted region and a semiconductor layer.

Figure 16:
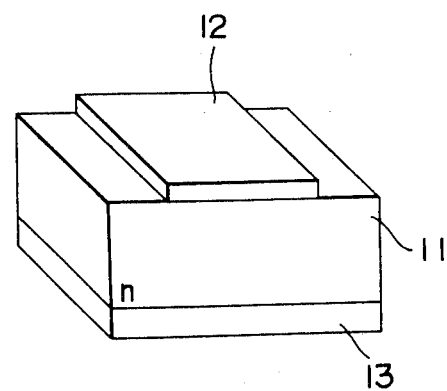
FIG. 16 is a perspective view illustrating the principal part of a model of a semiconductor device employed for obtaining various data.

FIG. 16 is a perspective view showing a model used for obtaining the above data. In FIG. 16, reference numeral 11 indicates a GaAs substrate having a carrier concentration of about $2 \times 10^{17}$ cm$^{-3}$; 12 designates a Schottky gate electrode measuring 100×150 μm and 2000 Å thick; and 13 identifies an electrode formed of AuGe/Au, the thicknesses of the AuGe and Au layers being 200 Å and 2000 Å, respectively. The electrode 13 was heat-treated at 450° C. for 2 minutes.

For obtaining the barrier height $\phi_B$ and the ideality factor $n_{if}$ from this model, the I-V characteristic is measured applying a voltage across the electrodes 12 and 13.

It has not yet been satisfactorily explained why the Schottky gate electrode formed of a refractory metal silicide on a compound semiconductor can withstands heat treatment temperatures higher than 850° C., but one of the reasons may be considered to reside in that the silicide does not readily react with the compound semiconductor.

As has been described in the foregoing, according to the present invention, by using the refractory metal silicide for the Schottky gate electrode, the positioning of the source and drain regions can be effected by self-alignment relative to the gate electrode. Accordingly, the present invention permits miniaturization of semiconductor devices employing the Schottky gate electrode, and hence it is of great utility when employed for fabrication of a semiconductor integrated circuit using a plurality of such semiconductor devices. Furthermore, the gate electrode structure according to the present invention can also be employed as a gate electrode of a high electron mobility transistor (HEMT).

In the present invention, the composition of the alloyed film is not limited specifically to a stoichiometric alloy composition, but may also be different from a stoichiometric value.

It will be apparent that many modifications and variations may be effected without departing from the scope of the novel concepts of this invention.

What is claimed is:

1. A semiconductor device, comprising a Schottky contact of at least one refractory metal silicide formed on a compound semiconductor substrate, wherein said Schottky contact on said substrate is characterized by a barrier height and an ideality factor that are stable with respect to heat treatment at a temperature up to at least 800° C.

2. The device of claim 1 wherein said silicide is of a Ti/W silicide alloy.

3. A semiconductor device including a Schottky contact on a compound semiconductor substrate, said Schottky contact comprising a material selected from the group consisting of Ti/W silicide alloy, MoSi, TaSi and WSi.

4. The device of claim 3, having a barrier height and an ideality factor that are stable with respect to heat treatment at a temperature up to at least 800° C.

5. The device of claim 1, 2 or 4, wherein said barrier height and ideality factor are stable up to at least 850° C.

6. The device of claim 1, 2 or 4, wherein said barrier height is stable up to at least 850° C.

7. The device of claim 5, said Schottky contact being of Ti/W silicide alloy or MoSi.

8. The device of claim 6, said Schottky contact being of TaSi or WSi.

9. The device of claim 1, 2, 3 or 4, said compound semiconductor being GaAs.

10. The device of claim 1, 2, 3 or 4, wherein each said silicide is such that it does not react with said compound semiconductor during said heat treatment.

11. The device of claim 5, said compound semiconductor being GaAs.

12. The device of claim 6, said compound semiconductor being GaAs.

13. The device of claim 7, said compound semiconductor being GaAs.

14. The device of claim 8, said compound semiconductor being GaAs.

* * * * *